(12) United States Patent
Bertolini et al.

(10) Patent No.: US 11,527,956 B2
(45) Date of Patent: Dec. 13, 2022

(54) CONTROL CIRCUIT FOR AN ELECTRONIC CONVERTER, RELATED INTEGRATED CIRCUIT, ELECTRONIC CONVERTER AND METHOD

(71) Applicant: STMicroelectronics S.r.l., Agrate Brianza (IT)

(72) Inventors: Alessandro Bertolini, Vermiglio (IT); Alberto Cattani, Cislago (IT); Alessandro Gasparini, Cusano Milanino (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 17/335,523

(22) Filed: Jun. 1, 2021

(65) Prior Publication Data
US 2021/0384830 A1    Dec. 9, 2021

(30) Foreign Application Priority Data
Jun. 8, 2020  (IT) .......................... 102020000013627

(51) Int. Cl.
*H02M 3/158*   (2006.01)
*H02M 1/00*    (2006.01)

(52) U.S. Cl.
CPC ......... *H02M 3/158* (2013.01); *H02M 1/0025* (2021.05)

(58) Field of Classification Search
CPC .. H02M 3/158; H02M 1/0025; H02M 1/0012; H02M 3/1566
See application file for complete search history.

(56) References Cited

U.S. PATENT DOCUMENTS

| | | | |
|---|---|---|---|
| 9,755,519 B1 | 9/2017 | Huang | |
| 2004/0066239 A1* | 4/2004 | Mariani | G01R 23/09 331/16 |
| 2012/0153917 A1 | 6/2012 | Adell et al. | |
| 2013/0141056 A1 | 6/2013 | Yang et al. | |
| 2015/0115914 A1* | 4/2015 | Chang | H02M 3/156 323/271 |

(Continued)

OTHER PUBLICATIONS

IT Search Report and Written Opinion for IT Appl. No. 102020000013627 dated Feb. 9, 2021 (10 pages).

*Primary Examiner* — Adolf D Berhane
*Assistant Examiner* — Afework S Demisse
(74) *Attorney, Agent, or Firm* — Crowe & Dunlevy

(57) ABSTRACT

A control circuit for controlling switching operation of a switching stage of a converter includes a phase detector circuit that generates a pulse-width modulated (PWM) signal in response to a phase comparison of two clock signals. A first clock signal has a frequency determined as a function of a first feedback signal proportional to converter output voltage. A first transconductance amplifier generates a first current indicative of a difference between a reference voltage and the first feedback signal, and a second transconductance amplifier generates a second current indicative of a difference between the reference voltage and a second feedback signal proportional to a derivative of the converter output voltage. A delay line introduces a delay in the first clock signal that is dependent on the first and second currents as well as a compensation current dependent on a selected operational mode of the converter.

36 Claims, 11 Drawing Sheets

(56) References Cited

U.S. PATENT DOCUMENTS

2016/0291621 A1    10/2016  Whidden et al.
2017/0294921 A1    10/2017  Kris et al.
2018/0191356 A1*    7/2018  Kesarwani ............ H03L 7/0995

* cited by examiner

CONTROL CIRCUIT FOR AN ELECTRONIC CONVERTER, RELATED INTEGRATED CIRCUIT, ELECTRONIC CONVERTER AND METHOD

PRIORITY CLAIM

This application claims the priority benefit of Italian Application for Patent No. 102020000013627, filed on Jun. 8, 2020, the content of which is hereby incorporated by reference in its entirety to the maximum extent allowable by law.

TECHNICAL FIELD

The embodiments of the present description refer to a control device for a buck converter.

BACKGROUND

Power-supply circuits, such as AC/DC or DC/DC switched mode power supplies, are well known in the art. There exist many types of electronic converters, which are mainly divided into isolated and non-isolated converters. For instance, non-isolated electronic converters are the converters of the "buck", "boost", "buck-boost", "Ćuk", "SEPIC", and "ZETA" type. Instead, isolated converters are, for instance, converters of the "flyback", "forward", "half-bridge", and "full-bridge" type. Such types of converters are well known to the person skilled in the art, as evidenced, for example, by the application note AN513/0393 "Topologies for Switched Mode Power Supplies", L. Wuidart, 1999, STMicroelectronics.

FIG. 1 is a schematic illustration of a DC/DC electronic converter 20. In particular, a generic electronic converter 20 comprises two input terminals 200a and 200b for receiving a DC voltage $V_{in}$ and two output terminals 202a and 202b for supplying a DC voltage $V_{out}$. For example, the input voltage $V_{in}$ may be supplied by a DC voltage source 10, such as a battery, or may be obtained from an AC voltage by means of a rectifier circuit, such as a bridge rectifier, and possibly a filtering circuit. The output voltage $V_{out}$ may be used to supply a load 30.

FIG. 2 shows the circuit schematic of a typical buck converter 20. In particular, a buck converter 20 comprises two input terminals 200a and 200b for receiving a DC input voltage $V_{in}$ and two output terminals 202a and 202b for supplying a regulated voltage $V_{out}$, where the output voltage is equal to or lower than the input voltage $V_{in}$.

In particular, typically, a buck converter 20 comprises two electronic switches Q1 and Q2 (with the current path thereof) connected (e.g., directly) in series between the input terminals 200a and 200b, wherein the intermediate node between the electronic switches Q1 and Q2 represents a switching node Lx. Specifically, the electronic switch Q1 is a high-side switch connected (e.g., directly) between the (positive) terminal 200a and the switching node Lx, and the electronic switch Q2 is a low-side switch connected (e.g., directly) between the switching node Lx and the (negative) terminal 200b, which often represents a ground GND. The (high-side) switch Q1 and the (low-side) switch Q2 hence represent a half-bridge configured to connect the switching node Lx to the terminal 200a (voltage $V_{in}$) or the terminal 200b (ground GND).

For example, the switches Q1 and/or Q2 are often transistors, such as Field-Effect Transistors (FETs), such as Metal-Oxide-Semiconductor Field-Effect Transistors (MOSFETs), for example, an n-channel FET, such as NMOS. Frequently, the second electronic switch Q2 is also implemented just with a diode, where the anode is connected to the terminal 200b and the cathode is connected to the switching node Lx.

In the example considered, an inductance, such as an inductor L, is connected (e.g., directly) between the switching node Lx and the (positive) output terminal 202a. Instead, the (negative) output terminal 202b is connected (e.g., directly) to the (negative) input terminal 200b.

In the example considered, to stabilize the output voltage $V_{out}$, the converter 20 typically comprises a capacitor Cout connected (e.g., directly) between the output terminals 202a and 202b.

In this context, FIG. 3 shows exemplary waveforms of the signals of such an electronic converter, where:
waveform a) shows the signal $DRV_1$ for switching the electronic switch Q1;
waveform b) shows the signal $DRV_2$ for switching the second electronic switch Q2;
waveform c) shows the current $I_{Q1}$ that traverses the electronic switch Q1;
waveform d) shows the voltage $V_{Lx}$ at the switching node Lx (i.e., the voltage at the second switch Q2); and
waveform e) shows the current $I_L$ that traverses the inductor L.

In particular, when the electronic switch Q1 is closed at an instant $t_1$ (ON state), the current $I_L$ in the inductor L increases (substantially) linearly. The electronic switch Q2 is at the same time opened. Then, when the electronic switch Q1 is opened after an interval $T_{ON1}$ at an instant $t_2$ (OFF state), the electronic switch Q2 is closed, and the current $I_L$ decreases (substantially) linearly. Finally, the switch Q1 is closed again after an interval $T_{OFF1}$. In the example considered, the switch Q2 (or a similar diode) is hence closed when the switch Q1 is open, and vice versa.

The current $I_L$ can thus be used to charge the capacitor Cout, which supplies the voltage $V_{out}$ at the terminals 202a and 202b.

In the example considered, the electronic converter 20 comprises thus a control circuit 22 configured to drive the switching of the switch Q1, and possibly of the switch Q2, for repeating the intervals $T_{ON1}$ and $T_{OFF1}$ periodically. For example, typically the buck converter 20 comprises also a feedback circuit (FBC) 24, such as a voltage divider, configured to generate a feedback signal FB indicative of (and preferably proportional to) the output voltage $V_{out}$, and the control circuit 22 is configured to generate the drive signals $DRV_1$ and optionally $DRV_2$ by comparing the feedback signal FB with a reference signal, such as a reference voltage $V_{REF}$.

A significant number of driving schemes are known for generating the drive signal $DRV_1$ and optionally $DRV_2$. These solutions have in common the possibility of regulating the output voltage $V_{out}$ by regulating the duration of the interval $T_{ON1}$ and/or the interval $T_{OFF1}$.

For example, in many applications, the control circuit 22 generates a Pulse-Width Modulation (PWM) signal $DRV_1$, wherein the duration of the switching interval $T_{SW}=T_{ON1}+T_{OFF1}$ is constant, but the duty cycle $T_{ON}/T_{SW}$ is variable. For example, a typical control scheme involves that the duration of the interval $T_{ON1}$ is varied via a regulator circuit having at least an integral component, such as a PI (Proportional-Integral) or PID (Proportional-Integral-Derivative) regulator.

Specifically, as well known, a buck converter may be operated in a Continuous-Conduction Mode (CCM), Discontinuous-Conduction Mode (DCM) or Transition Mode (TM).

As shown in FIG. 4A, when the control circuit 20 operates the converter in the CCM mode, the current $I_L$ flowing through the inductance L has a value different from zero at the end of the interval $T_{OFF1}$. In this case, the control circuit 20 uses two switching phases $T_1$ and $T_2$, with $T_{SW}=T_1+T_2$, wherein:

during the phase $T_1$ ($T_1=T_{ON1}=T_{OFF2}$) the switch Q1 is closed and the switch/diode Q2 is opened; and
during the phase $T_2$ ($T_2=T_{OFF1}=T_{ON2}$) the switch Q1 is opened and the switch/diode Q2 is closed.

For example, in CCM, the control circuit 20 may use switching cycles $T_{SW}$ with fixed duration, but the switch-on duration $T_{ON1}=T_1$ may be varied via a PID regulator, i.e., the signal $DRV_1$ is a PWM signal with (fixed or predetermined frequency) but the switch-on duration/duty cycle is determined as a function of the output voltage (and the reference signal $V_{REF}$). Conversely, the optional signal $DRV_2$ may correspond to the inverted version of the signal $DRV_1$.

Conversely, as shown in FIG. 4B, when the control circuit 20 operates the converter in the DCM mode, the current $I_L$ flowing through the inductance L reaches zero during the interval $T_{OFF1}$ and remains at zero until the end of the interval $T_{OFF1}$. In this case, the control circuit 20 uses indeed three switching phases $T_1$, $T_2$ and $T_3$, with $T_{SW}=T_1+T_2+T_3$, wherein:

during the phase $T_1$ ($T_1=T_{ON1}$) the switch Q1 is closed and the switch/diode Q2 is opened;
during the phase $T_2$ ($T_2=T_{ON2}$) the switch Q1 is opened and the switch/diode Q2 is closed; and
during the phase $T_3$ ($T_{OFF1}=T_2+T_3$ and $T_{OFF2}=T_3+T_1$) the switch Q1 is opened and the switch/diode Q2 is opened.

For example, when using a diode as switch Q2, this diode will automatically open when the current $I_L$ reaches zero, thereby ending the interval $T_2$. Conversely, when using a controllable electronic switch Q2, usually the control circuit 20 comprises (or is connected to) a demagnetization detection circuit configured to determine the instant when the current $I_L$ reaches zero (corresponding to the end of the interval $T_2$ and the beginning of the interval $T_3$). For example, such a demagnetization detection circuit may monitor the current $I_L$. For example, in FIG. 2 is shown a current sensor 24b connected in series with the electronic switch Q2, such as a shunt resistor, which thus generates a measurement signal CS indicative of (and preferably proportional to) the current $I_L$ flowing during the interval $T_2$ through the inductance L.

Accordingly, in DCM, the control circuit 20 may again use switching cycles $T_{SW}$ with fixed duration, where the switch-on duration $T_{ON1}=T_1$ may again be varied via a PID regulator, i.e., the signal $DRV_1$ is a PWM signal with (fixed or predetermined frequency), and the switch-on duration/duty cycle is determined as a function of the output voltage (and the reference signal $V_{REF}$). However, when using a controllable electronic switch Q2, the control circuit 20 may be configured to open the electronic switch Q2 when the signal CS indicates a demagnetization of the inductance L.

The CCM and the DCM modes of a buck converter thus have in common that often a fixed frequency PWM signal $DRV_1$ may be used to drive the electronic switch Q1. Conversely, an optional drive signal $DRV_2$ may be determined as a function of the drive signal $DRV_1$ and (when operated in DCM) an additional signal CS indicative of the demagnetization of the inductance L.

In general, also (usually fixed) dead times may be introduced between the switching of the drive signals, e.g., between the falling edge of the signal $DRV_1$ and the rising edge of the signal $DRV_2$, and similarly (in CCM mode) between the falling edge of the signal $DRV_2$ and the rising edge of the signal $DRV_1$. Insofar as these intervals are usually short compared to the durations $T_{ON}$ and $T_{OFF}$, these intervals will not be considered in the following and are not explicitly shown in FIGS. 3, 4A and 4B. However, also in this case, the drive signal $DRV_2$ may be determined as a function of the drive signal $DRV_1$.

Other electronic converters often using a PWM modulation are, for example, boost, buck-boost, flyback or forward converters, various types of half-bridge converter, etc.

For example, FIG. 5 shows an example of a boost converter. Specifically, in the example considered, an inductance, such as an inductor L, is connected (e.g., directly) between the positive input terminal 200a and a switching node Lx. The switching node Lx is connected (e.g., directly) via (the current path of) a first electronic switch S1 to the negative input terminal 200b, which in turn is usually connected (e.g., directly) to the negative output terminal 202b. The switching node Lx is also connected (e.g., directly) via (the current path of) a second electronic switch S2 to the positive output terminal 202a. For example, the electronic switches S1 and S2 may be MOSFET. Generally, the electronic switch S2 may also be implemented only with a diode. Usually a capacitance Cout, such as a capacitor, is connected between the output terminals 202a and 202b.

Also in this case the electronic switch S1 may be driven via a PWM signal $DRV_1$, wherein the duty cycle is determined as a function of the output voltage $V_{out}$ and a reference voltage $V_{REF}$. Conversely, when a controllable electronic switch S2 is used, the electronic switch S2 may be driven via a signal $DRV_2$, which:

in CCM may correspond to the inverted version of the signal $DRV_1$; or
in DCM may be determined as a function of the signal $DRV_1$ and a signal CS indicative of the demagnetization of the inductance L, such as a current measurement signal CS being proportional to the current $I_L$ flowing through the inductance L.

In this respect, FIG. 6 shows a generic electronic converter 20 using a PWM signal DRV with fixed or predetermined frequency. Specifically, the electronic converter 20 comprises a switching stage 26 connected between the input terminals 200a, 200b and the output terminal 202a, and 202b. Such a switching stage 26 comprises one or more electronic switches $SW_{26}$ and at least one inductance $L_{26}$, such as provided by an inductor or transformer, and optionally one or more capacitances $C_{26}$, such as capacitors. For example, in a buck converter (FIG. 2), these components are the switch Q1, the switch or diode Q2, the inductor L and the capacitor Cout. Conversely, in a boost converter (FIG. 5), these components are the switch S1, the switch or diode S2, the inductor L and the capacitor Cout.

In the example considered, the control circuit 22 comprises a driver circuit 222 configured to generate one or more drive signals for the switching stage 26 as a function of:

the PWM signal DRV, which has switching cycles $T_{SW}$ (with fixed or predetermined period) wherein the signal DRV is set to a first logic level (e.g., high) for a first duration $T_{ON}$ and to a second logic level (e.g., low) for a second duration $T_{OFF}$, with $T_{SW}=T_{ON}+T_{OFF}$ (see, also, FIG. 7) and
an optional measurement signal CS indicative of the demagnetization of the inductance $L_{26}$.

For example, as mentioned before, the PWM signal DRV may be used to drive the switch Q1 of FIG. 2 and the switch S1 of FIG. 5. Conversely, the measurement signal CS may be used when the electronic converter is operated in the DCM mode, e.g., for driving the electronic switch Q2 of FIG. 2 or the switch S2 of FIG. 5.

In line with the description of FIG. 2, usually a feedback circuit 24 is used to generate a feedback signal FB indicative of (and preferably proportional to, e.g., corresponding to) the output voltage $V_{out}$. Next, a regulator circuit 220, such as a PID regulator, may vary the duration $T_{ON}$ of the PWM signal DRV as a function of the feedback signal FB and a reference signal $V_{REF}$.

For example, as described in U.S. Pat. No. 9,091,741 B2, such PID regulators are often implemented with an error amplifier comprising an operational amplifier and a feedback network comprising one or more capacitors and resistors.

Recently another type of regulator circuit 220 has been used, wherein a time-based regulation is used to generate the PWM signal DRV. Time-based DC-DC converters are gaining popularity because this type of control scheme offers many advantages. By virtue of the continuous-time digital nature of the time-based regulators, they combine the advantages of conventional analog and digital controller circuit 220. Basically, they operate with (e.g., CMOS-level) digital signals, but without adding any quantization error typically found in digital controllers. Deploying simple circuits such as ring oscillators, delay lines, and flip-flops, time-based regulator circuits 220 eliminate the need for wide bandwidth error amplifiers and PWM blocks in analog regulator circuits, or high-resolution analog-to-digital converters (ADCs) and digital PWM blocks in digital regulator circuits. Using time as the processing variable, this new type of control provides an attractive solution for implementing wide-bandwidth high-switching frequency PWM-based electronic converters, because it obviates the need for power and area demanding wide bandwidth amplifiers and high-speed comparators present in conventional PID controllers.

Considering the foregoing, there is a need in the art to provide a time-based control device for a PWM driven electronic converter, such as a buck or boost converter.

SUMMARY

One or more embodiments relates to a control circuit for an electronic converter. Embodiments moreover concern a related integrated circuit, electronic converter and method.

As mentioned before, various embodiments of the present disclosure relate to a control circuit for a switching stage of an electronic converter, such as a buck or boost converter. In various embodiments, the electronic converter is configured to provide via two output terminals an output voltage.

In various embodiments, the control circuit comprises one or more first terminals configured to provide one or more respective drive signals to one or more electronic switches of the switching stage, a second terminal configured to receive from a feedback circuit a first feedback signal proportional to the output voltage, a third terminal configured to receive from an analog differentiator a second feedback signal proportional to the derivative of the output voltage, and a fourth terminal configured to receive a control signal indicative of a requested mode of operation from a processing circuit.

In various embodiments, the control circuit comprises a driver circuit configured to generate the one or more drive signals as a function of a Pulse-Width Modulation (PWM) signal, wherein the driver circuit is configured to change mode of operation as a function of the control signal. For example, in various embodiments, the driver circuit is configured to selectively operate the switching stage in DCM or CCM as a function of the control signal.

In various embodiments, the control circuit comprises also a PWM signal generator circuit configured to generate the PWM signal as a function of the first feedback signal, the second feedback signal and a reference voltage.

Specifically, in various embodiments, the PWM signal generator circuit comprises a first oscillator configured to generate a first clock signal and a second oscillator configured to generate a second clock signal, wherein at least one of the first and the second oscillator generates a respective first and second clock signal having a frequency determined as a function of the first feedback signal. The PWM signal generator also comprises a phase detector having inputs coupled to the first oscillator and the second oscillator and providing the PWM signal at an output. For example, in various embodiments the first oscillator is a voltage controlled oscillator configured to generate the first clock signal with a frequency determined as a function of the first feedback signal, and the second oscillator is configured to generate the second clock signal with a frequency determined as a function of a reference voltage. Conversely, in various embodiments, the first oscillator is a current controlled oscillator configured to generate the first clock signal with a frequency determined as a function of a first current, and the second oscillator is a current controlled oscillator configured to generate the second clock signal with a frequency determined as a function of a second current. In this case, an operational transconductance amplifier may be configured to provide the first current and the second current, wherein the difference between the second current and the first current is proportional to the difference between the reference voltage and the first feedback signal.

In particular, in various embodiments, the PWM signal generator circuit comprises also a first operational transconductance amplifier configured to generate a first current indicative of the difference between the reference voltage and the first feedback signal, and a second operational transconductance amplifier configured to generate a second current indicative of the difference between the reference voltage and the second feedback signal. A current generator is configured to generate a compensation current as a function of the control signal, and one or more first current-controlled delay lines are connected between the first oscillator and the phase detector and/or one or more second current-controlled delay lines are connected between the second oscillator and the phase detector, wherein the one or more first current-controlled delay lines and/or the one or more second current-controlled delay lines are driven via the first current, the second current and the compensation current.

For example, in various embodiments, the PWM signal generator circuit comprises a first current-controlled delay line connected between the first oscillator and the phase detector, wherein the first current-controlled delay has a delay determined as a function of a respective current and a second current-controlled delay line connected between the second oscillator and the phase detector, wherein the second current-controlled delay has a delay determined as a function of a respective current.

In this case, the first operational transconductance amplifier may be a differential operational transconductance amplifier configured to provide a first current and a second current, wherein the difference between the second current and the first current is proportional to the difference between a reference voltage and the first feedback signal. Similarly, the second operational transconductance amplifier may be a differential operational transconductance amplifier configured to provide a first current and a second current, wherein the difference between the second current and the first current is proportional to the difference between the reference voltage and the second feedback signal. Accordingly, a first summation node may provide the current to the first current-controlled delay by adding the respective first currents provided by the first and second operational transconductance amplifiers. Conversely, a second summation node may provide the current to the second current-controlled delay by adding the respective second currents provided by the first and second operational transconductance amplifiers.

For example, in this case, the compensation current may be subtracted from the first summation node or added to the second summation node. In general, also a portion of the compensation current may be subtracted from the first summation node, and a portion of the compensation current may be added to the second summation node.

For example, when the control signal indicates a DCM or CCM operation, the compensation current may have a first value when the control signal indicates a DCM operation and a second value when the control signal indicates a CCM operation, wherein the second value is greater than the first value.

BRIEF DESCRIPTION OF THE DRAWINGS

The embodiments of the present disclosure will now be described with reference to the annexed plates of drawings, which are provided purely to way of non-limiting example and in which.

The features and advantages of the present invention will become apparent from the following detailed description of practical embodiments thereof, shown by way of non-limiting example in the accompanying drawings, in which.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is comprised in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are only provided for convenience and hence do not define the sphere of protection or the scope of the embodiments.

In FIGS. 8 to 14 described below, parts, elements or components that have already been described with reference to FIGS. 1 to 7 are designated by the same references used previously in these figures. The description of these elements has already been made and will not be repeated in what follows in order not to burden the present detailed description.

As explained in the foregoing, various embodiments of the present description relate to an improved time-based control circuit 22a for an electronic converter. For a general description of electronic converters using a PWM signal reference can be made to the previous description of FIGS. 1 to 7.

Figure 8:
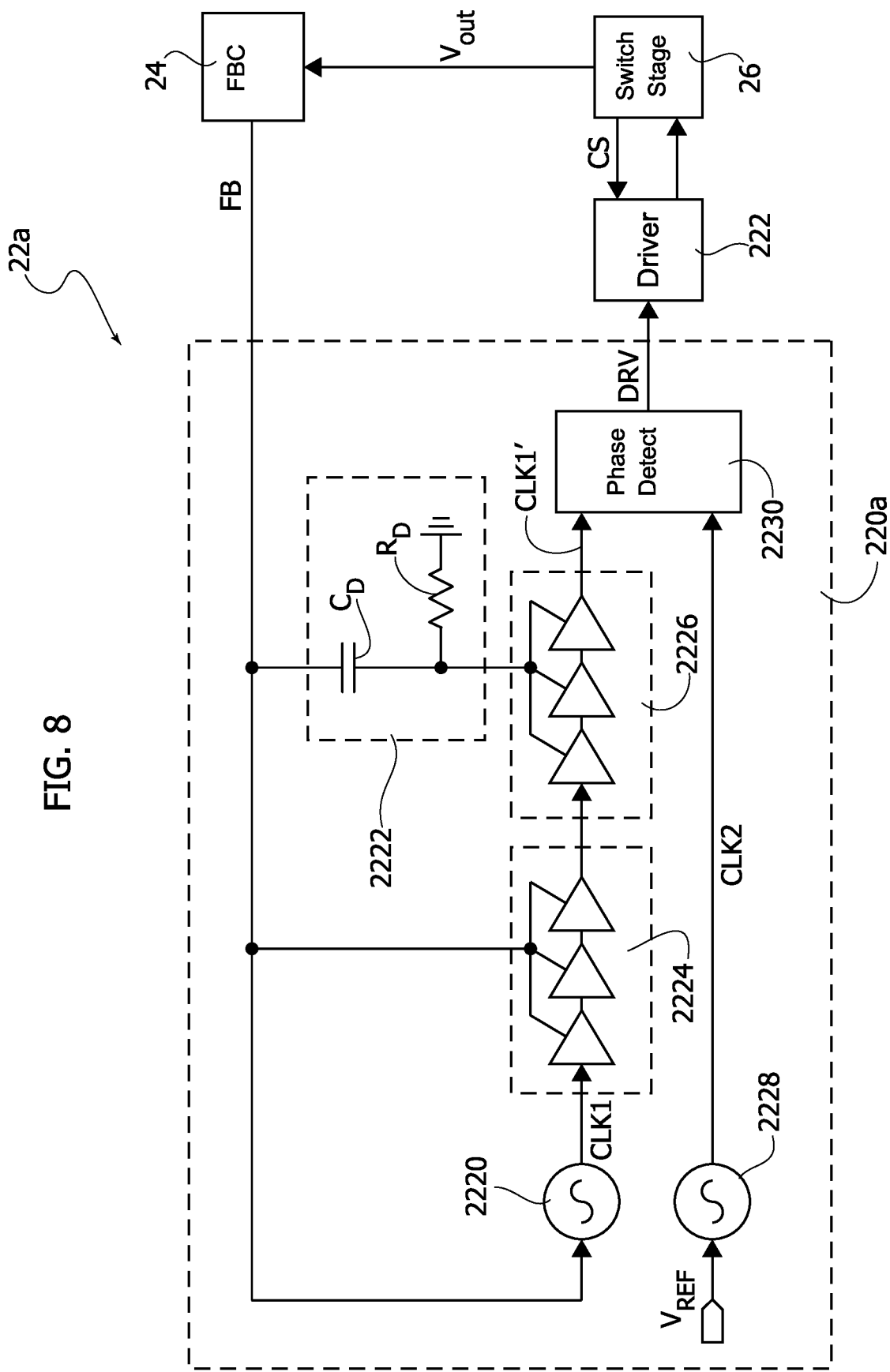
FIG. 8 shows a first embodiment of a control circuit for the electronic converter of FIG. 6.

FIG. 8 schematically shows a time-based control circuit 22a, e.g., in the form of an integrated circuit. Specifically, also in this case, the control circuit 22a comprises:

a PWM signal generator 220a configured to generate a PWM signal DRV as a function of a feedback signal FB indicative of the output voltage $V_{out}$ generated by the switching stage 26 of the electronic converter and a reference voltage $V_{REF}$; and a driver circuit 222 configured to drive a switching stage 26 as a function of the PWM signal DRV.

Specifically, in the embodiment considered, the PWM signal generator 220a comprises:

a first voltage-controlled oscillator 2220 configured to generate a first clock signal CLK1 as a function of the feedback signal FB;

an analog differentiator 2222 configured to generate a signal indicative of (and preferably proportional to) the derivative of the feedback signal FB, e.g., implemented with a capacitor $C_D$ and a resistor $R_D$ connected in series between the feedback signal FB and a reference voltage, e.g., ground (which may correspond, e.g., to the negative input terminal 200b or the negative output terminal 202b), wherein the intermediate node between the capacitor $C_D$ and the resistor $R_D$ corresponds to the signal indicative of the derivative of the feedback signal FB;

a first delay line 2224 having a delay as a function of the feedback signal FB and a second delay line 2226 having a delay as a function of the signal indicative of the derivative of the feedback signal FB, wherein the first and second delay lines are connected in cascade and generate a delayed first clock signal CLK1';

a second voltage-controlled oscillator 2228 configured to generate a second clock signal CLK2 as a function of the reference voltage $V_{REF}$; and a phase detector circuit 2230 configured to generate the PWM signal DRV, wherein the duty cycle of the PWM signal DRV is determined as a function of the phase difference Φ between the clock signal CLK2 and the delayed clock signal CLK1'.

Delay lines having a programmable delay as a function of a voltage or current signal are well known in the art. For example, in this context may be cited U.S. Pat. Nos. 5,650,739 A or 7,696,799 B2.

Figure 9:
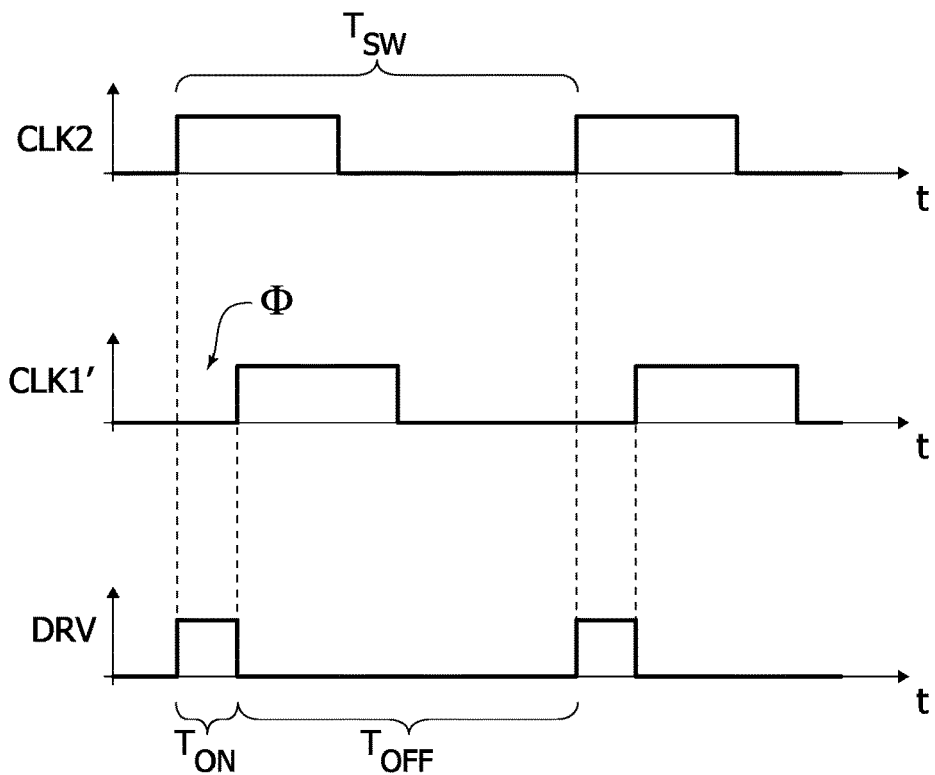
FIG. 9 shows exemplary waveforms of the control circuit of FIG. 8.

For example, as shown in FIG. 9, the phase detector circuit 2230 may be configured to set the signal DRV to high when the second clock signal CLK2 is high and the delayed first clock signal CLK1' is low. For example, the phase detector 2230 may be implemented with one or more logic gates and/or one or more latches.

In the embodiment considered, the second voltage-controlled oscillator 2228 provides thus a clock signal CLK2 having a given (fixed or settable) frequency as a function of the reference voltage $V_{REF}$. Conversely, the first voltage-controlled oscillator 2220 varies the frequency of the first clock signal CLK1 until the feedback signal FB corresponds to the reference voltage $V_{REF}$, and in this steady condition the frequency of the first clock signal CLK1 corresponds to the frequency of the second clock signal CLK2, but the clock signals are phase shifted by a given phase $\Phi_I$. The first oscillator 2220 thus implements a regulator with an integral component of the phase $\Phi_I$. Conversely, the first delay line 2224 and the second delay line 2226 introduce an additional phase $\Phi_P$ being proportional to the feedback signal FB and an additional phase $\Phi_D$ being proportional to the derivative of the feedback signal FB, i.e., the total phase shift Φ corresponds to:

$$\Phi = \Phi_I + \Phi_P + \Phi_D$$

wherein, as shown in FIG. 9, the phase shift Φ is proportional to (and preferably corresponds to) the switch on duration $T_{ON}$ (e.g., $T_{ON} = T_{SW}(\Phi/2\pi)$), i.e., the signal DRV is a PWM signal wherein the switch-on duration $T_{ON}$/the duty cycle is varied via a time-based control (with PID regulation) of the phase shift Φ as a function of the feedback signal FB and the reference voltage $V_{REF}$. Accordingly, the phase detector 2230 may also perform other operations, such as a down-scaling operation of the frequency of the clock signals CLK1/CLK2, and it is only relevant that the phase detector 2230 is configured to generate a PWM signal DRV, wherein the switch-on duration $T_{ON}$ of the signal DRV is determined as a function of the phase shift Φ.

The inventors have observed that in many applications a large flexibility is requested to the electronic converter. In order to maximize efficiency and performance, it is typically requested to work in different modes (e.g., DCM, CCM, asynchronous mode, synchronous mode, optimized to follow TDMA variations, deterministic/repetitive abruptly load/line variations, etc.) and to maintain very high performance in different scenarios. In such conditions, the design of a DC-DC converter is rather complicate.

As described in the foregoing, a DC-DC converter is usually a closed loop system with a certain loop bandwidth. In this respect, the inventors have observed that a feed-forward action may be used as an additional "out-of-the-loop compensation action", which may help to compensate specific events or variabilities. These feed-forwards acting out of the main loop, which is by definition "slow" and has limited bandwidth, are designed to be very fast and quickly compensate a specific event, so that the main loop does not have to take care of the input event.

For example, as described in the foregoing, a control circuit 20a may decide to operate the converter in CCM or DCM mode. Accordingly, the control circuit 20a may use a feed-forward action to compensate the transition between these operating modes, such as the switching from CCM to DCM (and vice versa) in a buck or boost DC-DC.

Specifically, in steady-state (e.g., constant input voltage $V_{in}$ and load 30) the control circuit 20a operates the converter with a duty-cycle given by the operating conditions. If the control circuit 20a is forced to switch from the CCM to DCM mode, the required duty-cycle to maintain regulation will be different.

Figure 10:
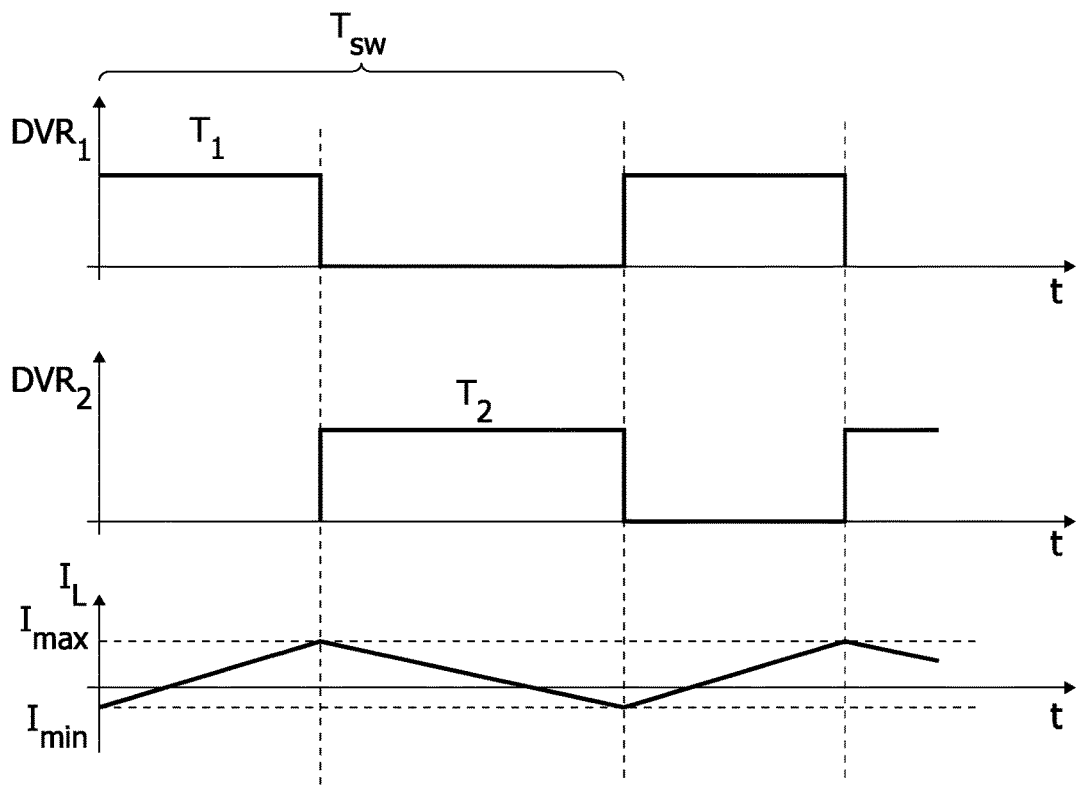
FIG. 10 shows waveforms when the electronic converter is operated in a CCM mode.

For example, usually, the converter should be operated in DCM mode when a smaller load 30 is connected to the output terminals 202a, 202b. In fact, as shown in FIG. 10, when the load decreases, the current $I_L$ at the end of the interval $T_2$ may become negative in the CCM mode. However, when the control circuit is forced to switch in this condition from CCM to DCM (see also FIG. 4B), the negative current will be suppressed, because the switch Q2 will be deactivated at the instant when the current $I_L$ becomes negative. Accordingly, this (missing negative current) results in an excessive charge transferred to the output capacitor Cout, which increases the output voltage $V_{out}$. Accordingly, without any feed-forward action, this transition is simply managed by the converter loop (the feedback circuit 24, the PWM signal generator 220a and the driver 222), e.g., by:

1) the converter is in steady-state in CCM,
2) DCM operation is forced,
3) since in DCM during the current $I_L$ is not allowed to become negative in the inductance L (in contrast to CCM), at the output 202a/202b may be transferred a charge in excess which increases the output voltage $V_{out}$,
4) the control loop (negative feedback) detects such deviation and produces a correction action, and
5) a new steady-state point is reached with a new duty-cycle.

Such new duty-cycle in DCM is different from (and usually smaller than) the previous one in CCM. However, as mentioned before, during such variations of the set-point or operating mode of the converter, overshoots or undershoots of the output voltage $V_{out}$ may occur, which are usually undesired.

Conversely, with a properly designed specific feed-forward compensation, when the passage from CCM to DCM is forced, a feed-forward compensator may turn on and in open loop it may move the control action to reduce the duty cycle and directly obtain the new one. In such a way, the output voltage $V_{out}$ does not experience any unwanted transient or such a transient is at least reduced.

Figure 11:
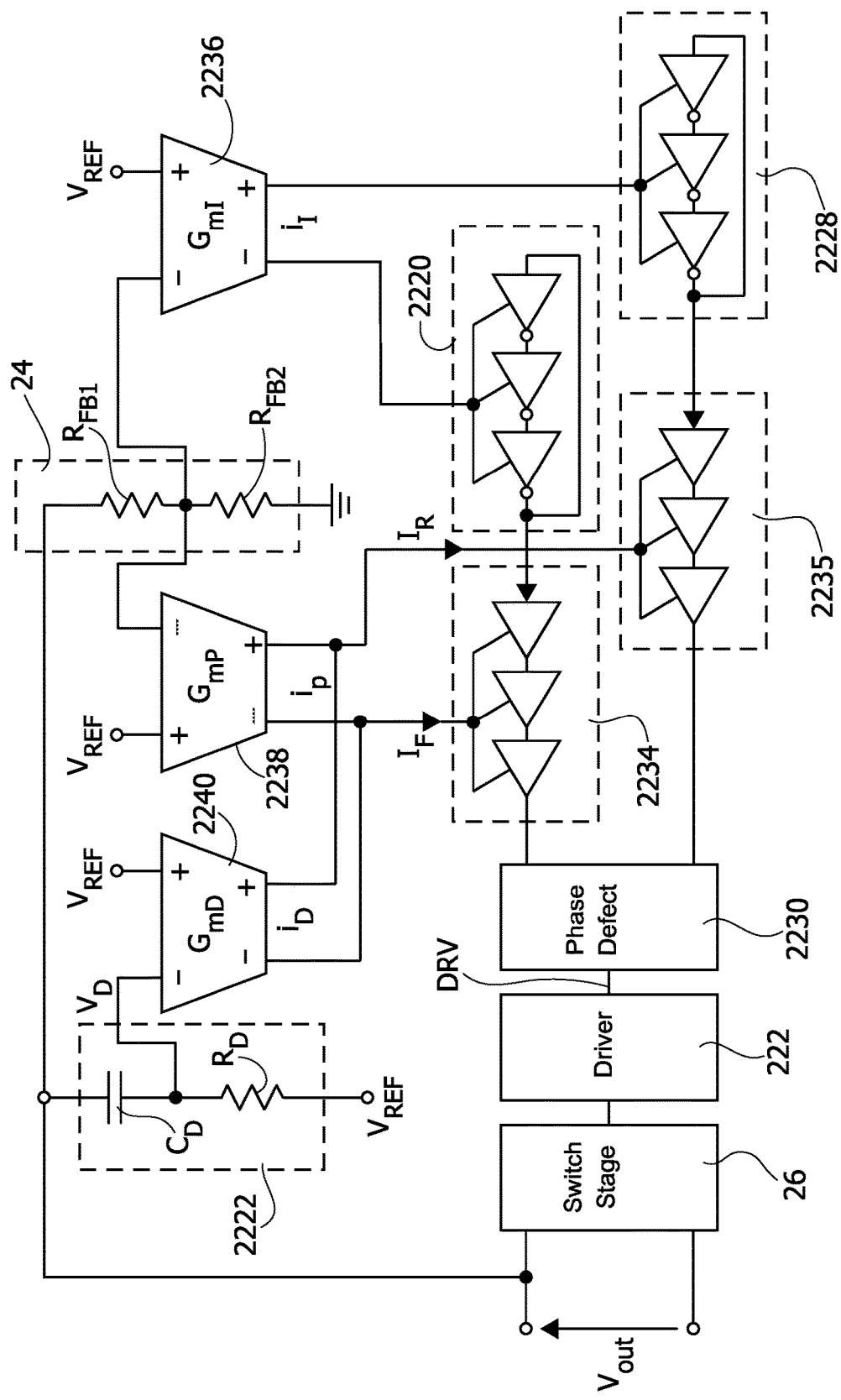
FIG. 11 shows a second embodiment of a control circuit for the electronic converter of FIG. 6.

FIG. 11 shows a second embodiment of a time-based PWM signal generator 220a.

Specifically, in the embodiment considered, the following modifications have been performed, which also may be used separately:

the voltage-controlled oscillators 2220 and/or delay lines 2224 and 2226 have been replaced with current-controlled oscillators and/or delay lines;

the delay lines 2224 and 2226 have been combined into the same delay line 2234;

a differential approach is used, wherein the oscillators 2220/2228 and/or the delay lines 2234/2235 are driven with differential signal.

Specifically, in the embodiment considered, again a feedback circuit 24 is used to determine a feedback signal FB proportional to the output voltage $V_{out}$. For example, in various embodiments, the feedback circuit 24 is implemented with a voltage divider 24 comprising two or more resistors $R_{FB1}$ and $R_{FB2}$ connected in series between the terminals 202a and 202b, wherein the voltage $V_{FB}$ at one of the resistors, e.g., resistor $R_{FB2}$, corresponds to the feedback signal FB.

In the embodiment considered, the feedback signal FB and the reference voltage $V_{REF}$ are provided to a first differential transconductor 2236, such as a differential operational transconductance amplifier (OTA). For example, in various embodiments, the differential transconductor 2236 provides:

a first current $i_{I+}=i_{I0}+i_I/2$; and a second current $i_{I-}=i_{I0}-i_I/2$.

Specifically, in a differential transconductor 2236 the difference $i_I=i_{I+}-i_{I-}$ between the currents $i_{I+}$ and $i_{I-}$ is proportional to the difference between the respective input voltages, i.e., the reference voltage $V_{REF}$ and the feedback voltage $V_{FB}$, i.e., $i_I=G_{MI}(V_{REF}-V_{FB})$.

In the embodiment considered, the current $i_{I+}$ is provided to the current-controlled oscillator 2228 and the current $i_{I-}$ is provided to the current-controlled oscillator 2220, such as two ring-oscillators. Accordingly, the oscillator 2228 generates a clock signal CLK2 having a frequency proportional to the current $i_{I+}$ and the oscillator 2220 generates a clock signal CLK1 having a frequency proportional to the current $i_{I-}$. Thus, when the feedback voltage $V_{FB}$ corresponds to the reference voltage $V_{REF}$, both oscillators are supplied with the current $i_{I0}$, which thus determines the steady state frequency of the clock signals CLK1 and CLK2.

Similarly, the feedback signal FB and the reference voltage $V_{REF}$ are provided to a second differential transconductor 2238, such as a differential operational transconductance amplifier (OTA). For example, in various embodiments, the differential transconductor 2238 provides:

a first current $i_{P+}=i_{P0}+i_P/2$; and a second current $i_{P-}=i_{P0}-i_P/2$.

Specifically, in the differential transconductor 2238 the difference $i_P=i_{P+}-i_{P-}$ between the currents $i_{P+}$ and $i_{P-}$ is proportional to the difference between the respective input voltages, i.e., the reference voltage $V_{REF}$ and the feedback voltage $V_{FB}$, i.e., $i_P=G_{MP}(V_{REF}-V_{FB})$.

In the embodiment considered, again an analog differentiator 2222 is used to generate a signal $V_D$ proportional to the derivative of the output voltage $V_{out}$. For example, in the embodiment considered, the analog differentiator 2222 is implemented with a capacitor $C_D$ and a resistor $R_D$ connected between the output voltage $V_{out}$ or the feedback signal FB, and a reference voltage, such as ground or preferably the reference voltage $V_{REF}$. For example, when connecting the resistor $R_D$ to the reference voltage $V_{REF}$ the derivative signal $V_D$ has an offset of $V_{REF}$ to which the derivative component of the output voltage $V_{out}$ is added.

In the embodiment considered, the derivative signal $V_D$, e.g., the voltage at the intermediate node between the capacitor $C_D$ and the resistor $R_D$, and the reference voltage $V_{REF}$ are provided to a third differential transconductor 2240, such as a differential operational transconductance amplifier (OTA). For example, in various embodiments, the differential transconductor 2240 provides:

a first current $i_{D+}=1_{D0}+i_D/2$; and a second current $i_{D-}=i_{D0}-i_D/2$.

Specifically, in the differential transconductor 2240 the difference $i_D=i_{D+}-i_{D-}$ between the currents $i_{D+}$ and $i_{D-}$ is proportional to the difference between the respective input voltages, i.e., the reference voltage $V_{REF}$ and the derivative signal $V_D$, i.e., $i_D=G_{MD}(V_{REF}-V_D)$.

Figure 1:
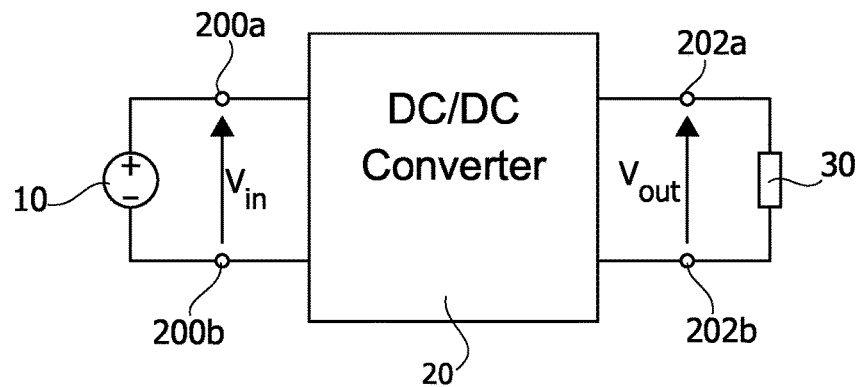
FIG. 1 shows an example of an electronic converter.
Figure 2:
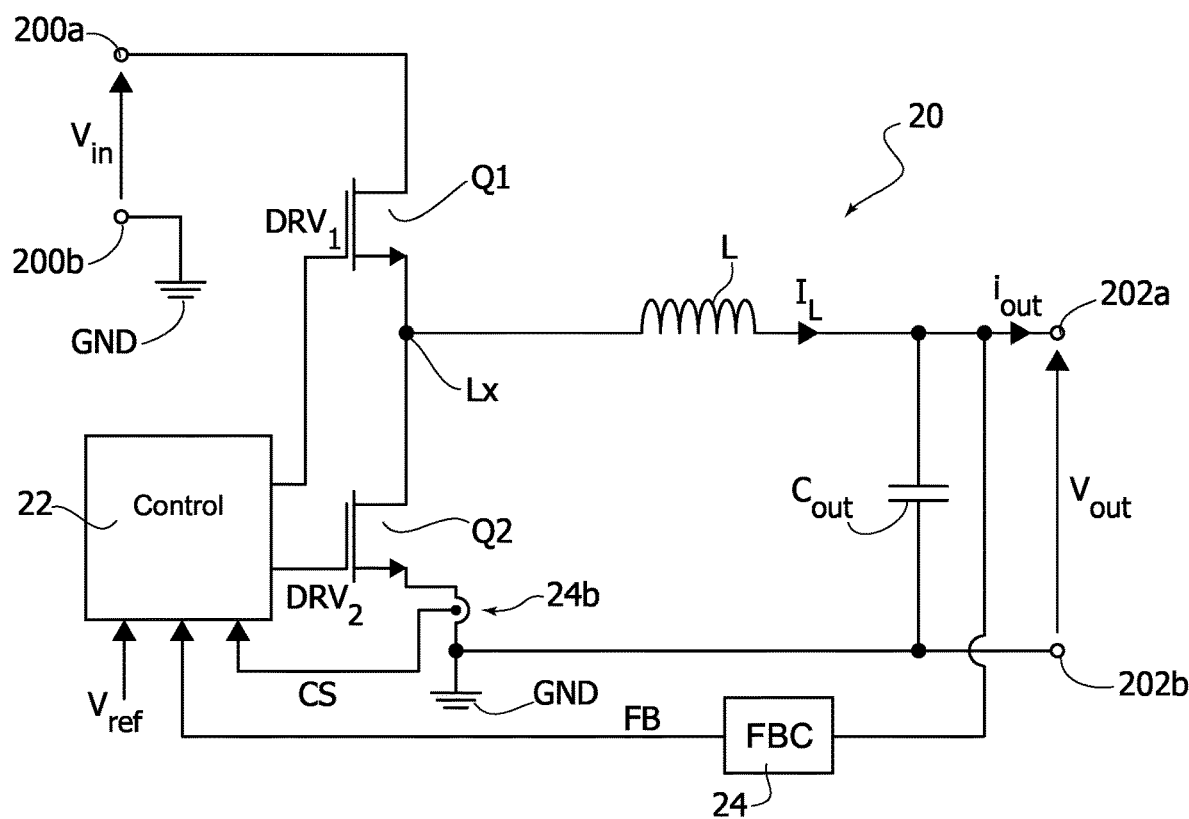
FIG. 2 shows an example of a buck converter.
Figure 3:
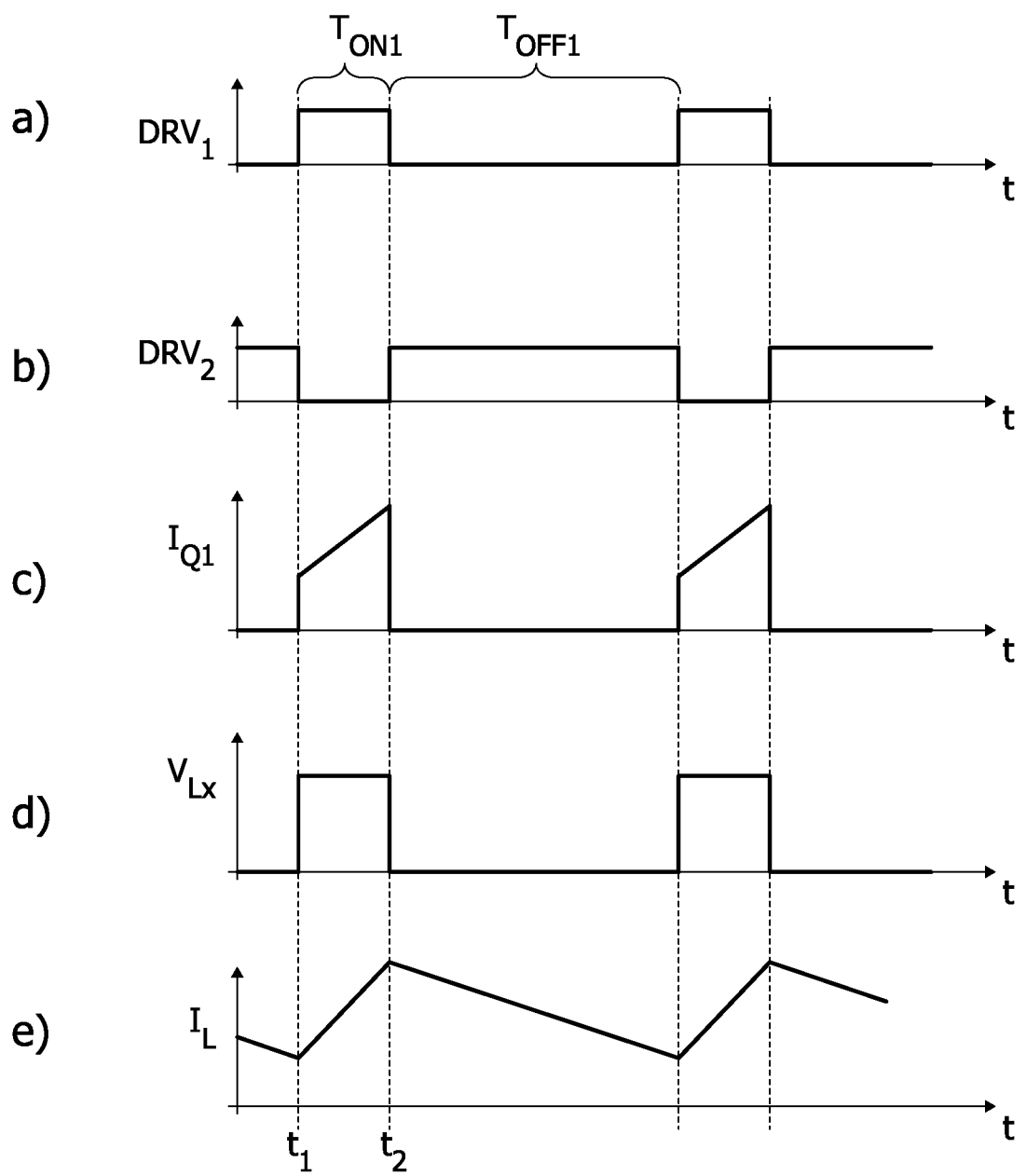
FIG. 3 shows exemplary waveforms of the buck converter of FIG. 2.
Figure 4A:
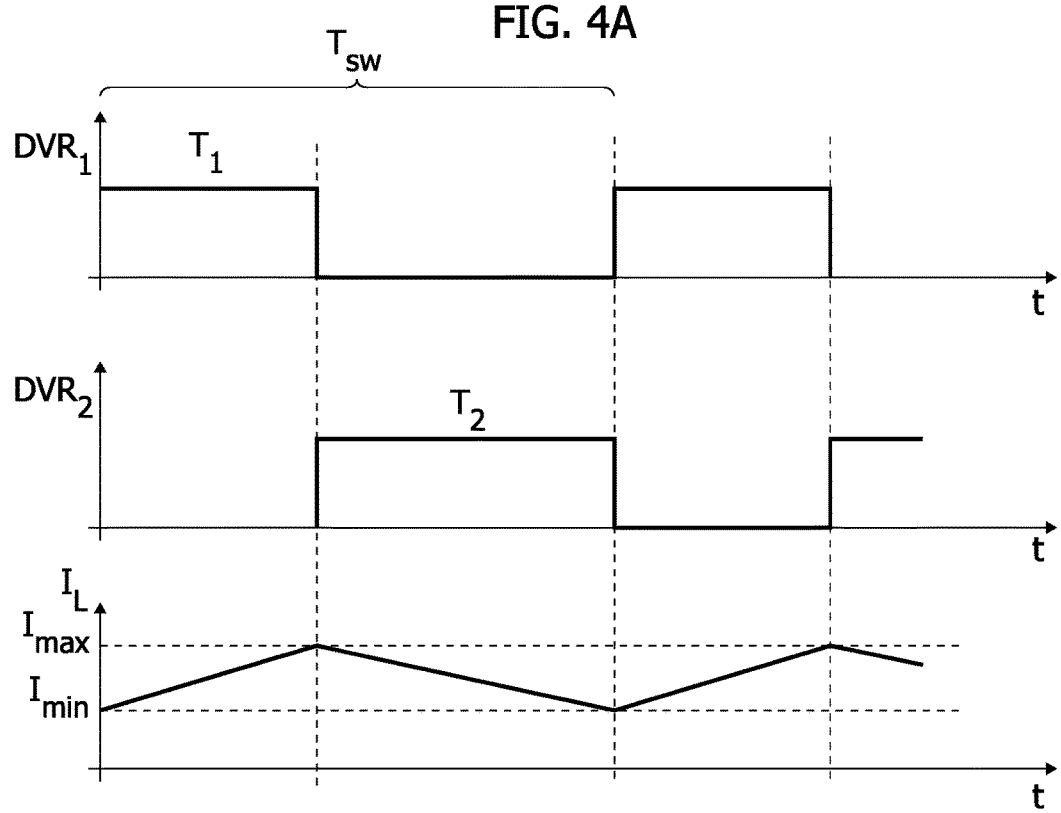
FIG. 4A shows waveforms when the buck converter of FIG. 2 is operated in a CCM mode.
Figure 4B:
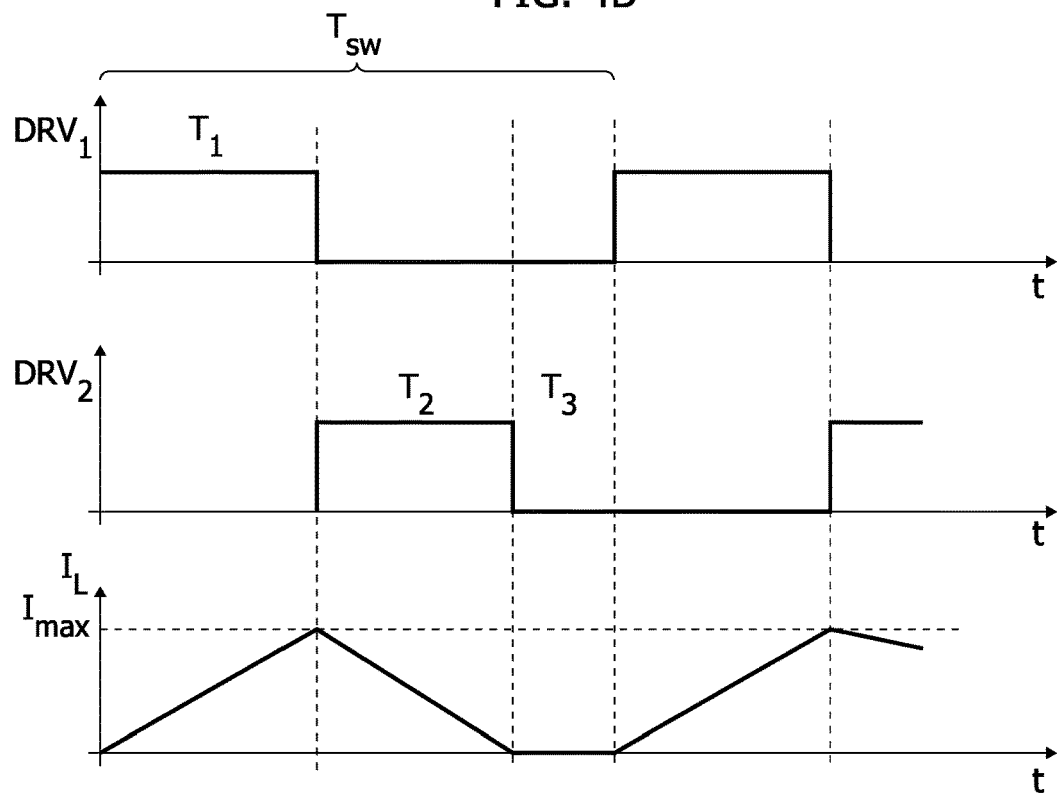
FIG. 4B shows waveforms when the buck converter of FIG. 2 is operated in a DCM mode.
Figure 5:
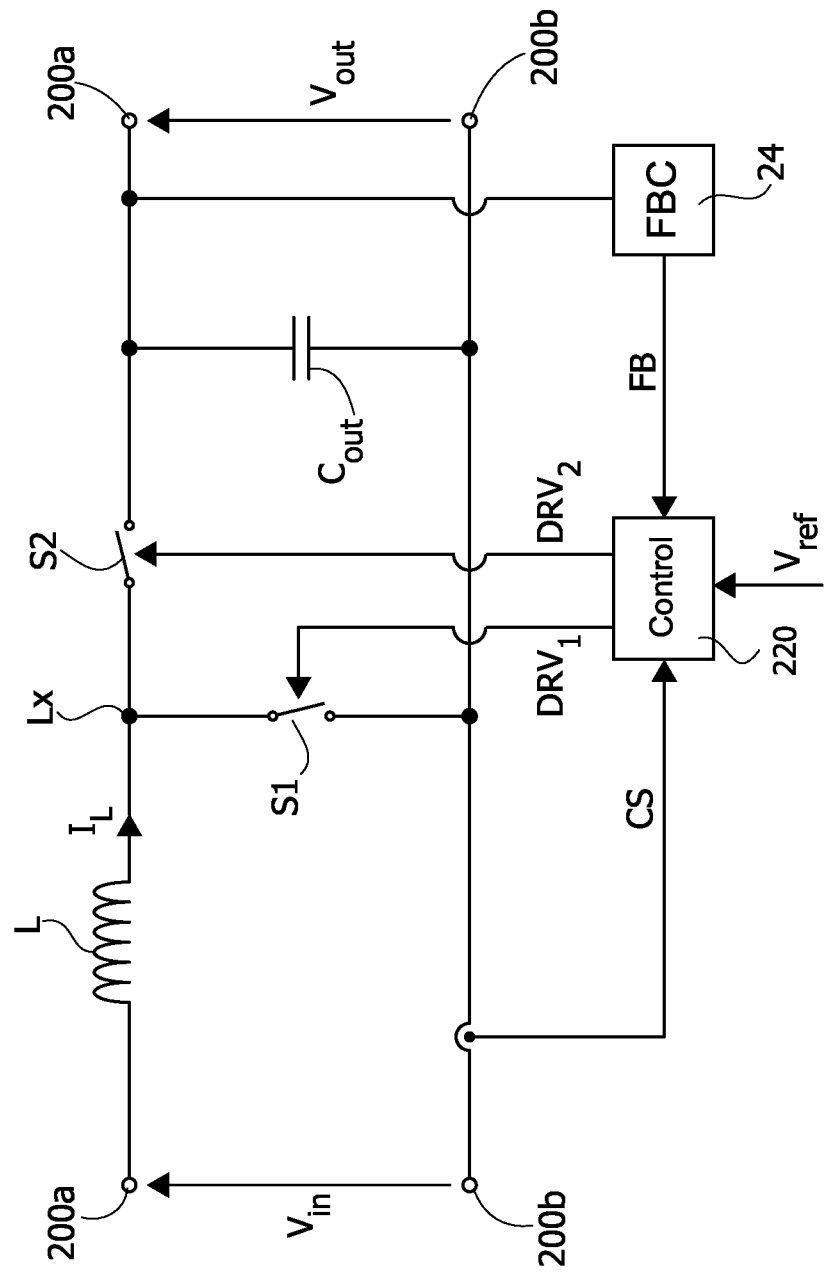
FIG. 5 shows an example of a boost converter.
Figure 6:
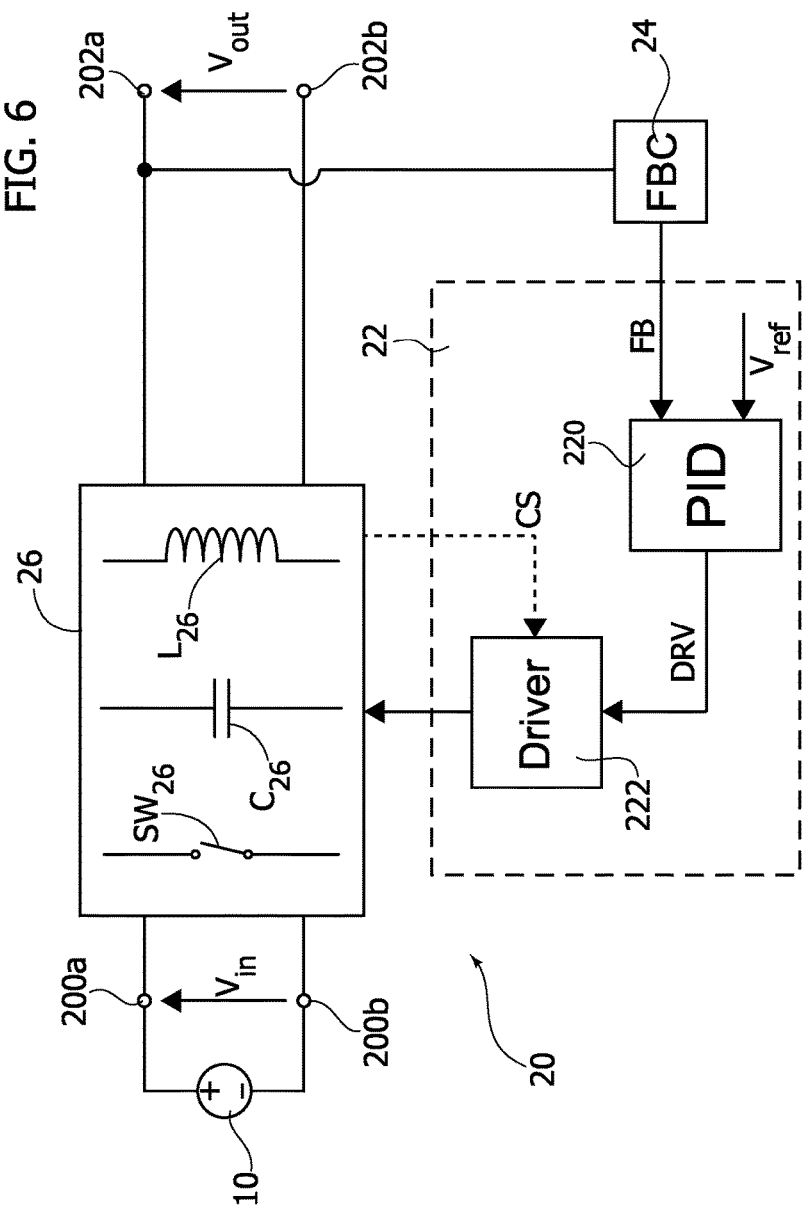
FIG. 6 shows an example of an electronic converter using a PWM signal.
Figure 7:
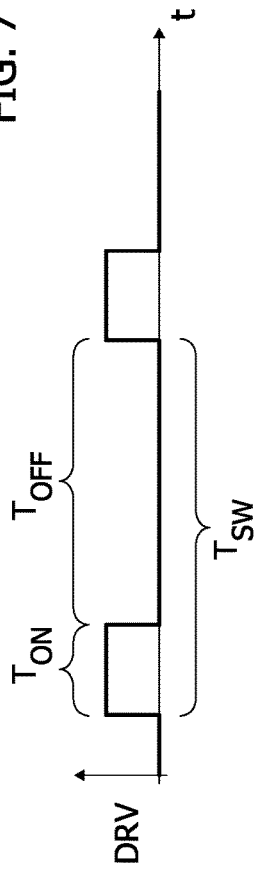
FIG. 7 shows an example of PWM signal of the electronic converter of FIG. 7.

Similar to the description of FIG. 7, the currents $i_{P+}$ and $i_{D+}$ and/or the currents $i_{P-}$ and $i_{D-}$ may be provided to respective delay lines, such as:

two delay lines connected in series (essentially corresponding to the delay lines 2224 and 2226) may be configured to generate a delayed version CLK1' of the clock signal CLK1 as a function of the currents $i_{P-}$ and $i_{D-}$, respectively; and/or two delay lines connected in series may be configured to generate a delayed version CLK2' of the clock signal CLK2 as a function of the currents $i_{P+}$ and $i_{D+}$.

Generally, the term "and/or" highlights the possibility that these delay lines may be provided for each clock signal (as shown in FIG. 11 for a differential approach) or only for a single clock signal (as shown in FIG. 8).

Conversely, in the embodiment considered, the currents $i_{P+}$ and $i_{D+}$ are provided to a first summation node, which thus provides a current $I_R=i_{P+}+i_{D+}$, and/or the currents $i_{P-}$ and $i_{D-}$ are provided to a second summation node, which thus provides a current $I_F=i_{P-}+i_{D-}$. In the embodiment considered, the current $I_R$ is provided to the delay line 2235 and/or the current $I_F$ is provided to the delay line 2234, such as a sequence of delay stages having a delay as a function of a respective supply current, i.e., the currents $I_F$ and $I_R$.

Figure 12:
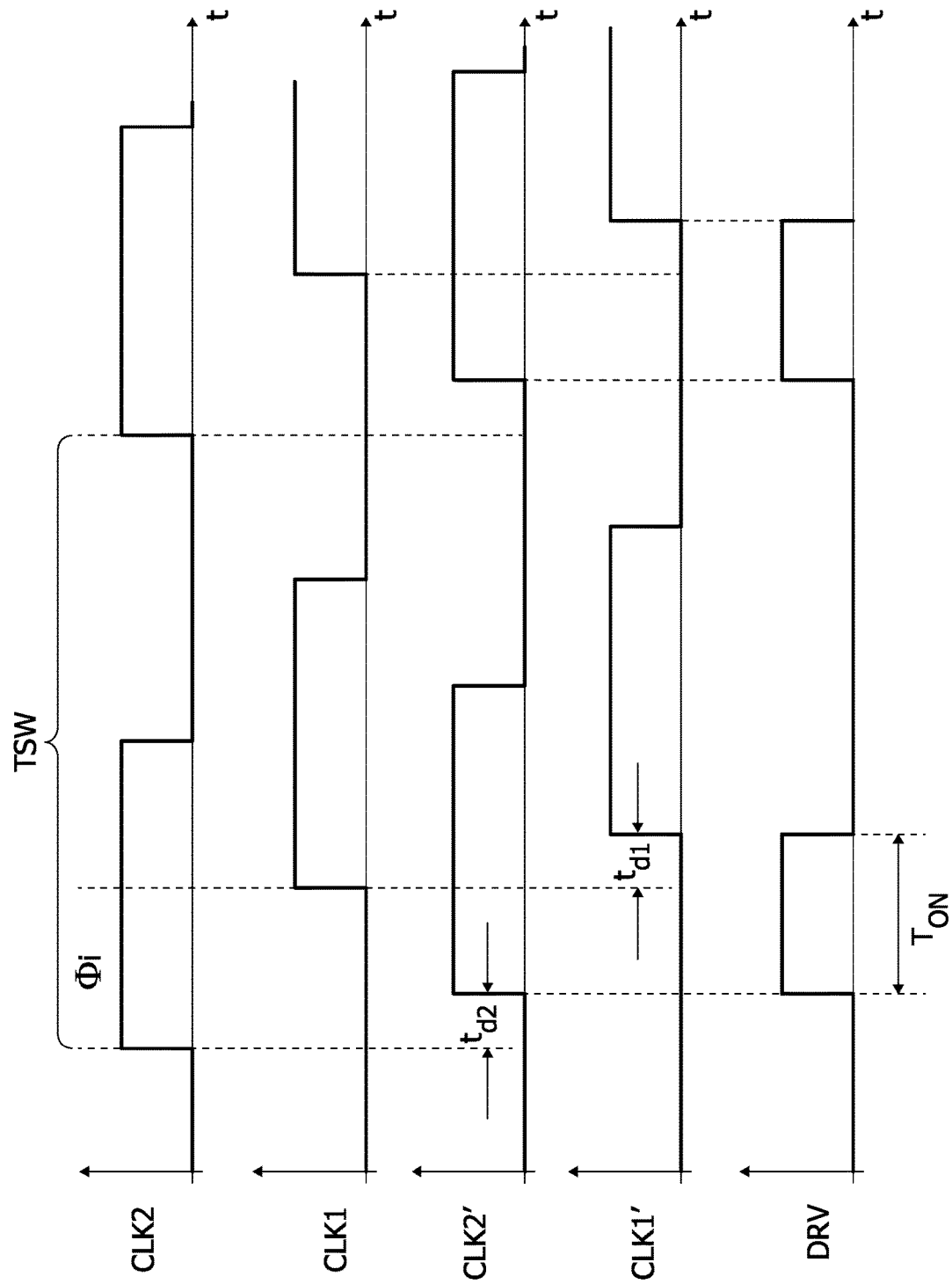
FIG. 12 shows exemplary waveforms of the control circuit of FIG. 11.

Accordingly, in the embodiment considered and as also shown in FIG. 12, the delay stage 2235 generates a delayed clock signal CLK2' having a delay $t_{d2}$ with respect to the clock signal CLK2 and/or the delay stage 2235 generates a delayed clock signal CLK1' having a delay $t_{d1}$ with respect to the clock signal CLK1.

In the embodiment considered, the delayed clock signals CLK2' and CLK1' are then provided to a phase detector, which is configured, for example, to:

set the signal DRV to a first logic level (e.g., high) at the rising edge of CLK2'; and set the signal DRV to a second logic level (e.g., low) at the rising edge of the signal CLK1'.

Thus, in the embodiment considered, in steady state, the feedback signal $V_{FB}$ corresponds to the reference voltage $V_{REF}$, and by connecting the analog differentiator to the reference voltage $V_{REF}$, also the signal $V_D$ corresponds to the reference voltage $V_{REF}$. Thus, in the steady state, the differential currents $i_D$, $i_P$ and $i_I$ are zero, and (when using a differential approach) the delay $t_{d1}$ of the delay line 2234 corresponds to the delay $t_{d2}$ of the delay line 2235. Moreover, the oscillators 2220 and 2228 provide two clock signals CLK1 and CLK2 having the same frequency and a phase-shift $\Phi_I$. Due to the fact, that the delay lines 2234 and 2235 introduce the same delay $t_{d1}=t_{d2}$ in the embodiment considered, the phase shift $\Phi$ between the delayed clock signals CLK1' and CLK2' corresponds to $\Phi_I$, e.g., the duration $T_{ON}$ corresponds to (or is proportional to) the delay $\Phi_I$, e.g., $T_{ON}=T_{SW}(\Phi_I/2\pi)$. Accordingly, the duty cycle $D=T_{ON}/T_{SW}$ of the signal DRV corresponds thus to $\Phi_I/2\pi$. For example, in a buck converter, the duty cycle may be determined (approximately) as a function of the input and output voltage, i.e., $D=\Phi_I/2\pi=V_{out}/V_{in}$.

As mentioned before, also only one of the delay lines 2234 or 2235 could be used or one of the delay lines could introduce a constant delay, i.e., one of the delays $t_{d1}$ or $t_{d2}$ could be zero or at least constant. In fact, in this case, the oscillators 2220 and 2228 would generate clock signals having a phase shift $\Phi_I$ which also compensate the constant delay $t_{d1}$ or $t_{d2}$.

Thus, when analyzing the delays $t_{d1}$ or $t_{d2}$, it is possible to observe that:
- when the delay $t_{d1}$ increases (and the delay $t_{d2}$ remains constant or decreases), the switch-on duration $T_{ON}$/duty cycle D immediately increases, and
- when the delay $t_{d2}$ increases (and the delay $t_{d1}$ remains constant or decreases), the switch-on duration $T_{ON}$/duty cycle D immediately decreases.

The inventors have thus observed that a switching of the duty cycle of the signal DRV (e.g., due to a changing operating condition) may be obtained by changing the delay $t_{d1}$ of the delay line 2234 and/or the delay $t_{d2}$ of the delay line 2235.

For example, when using current controlled delay lines 2234 and/or 2235, the delays $t_{d1}$ and/or $t_{d2}$ may be modified by varying the bias currents $I_F$ and/or $I_R$ of the delay lines.

Figure 13:
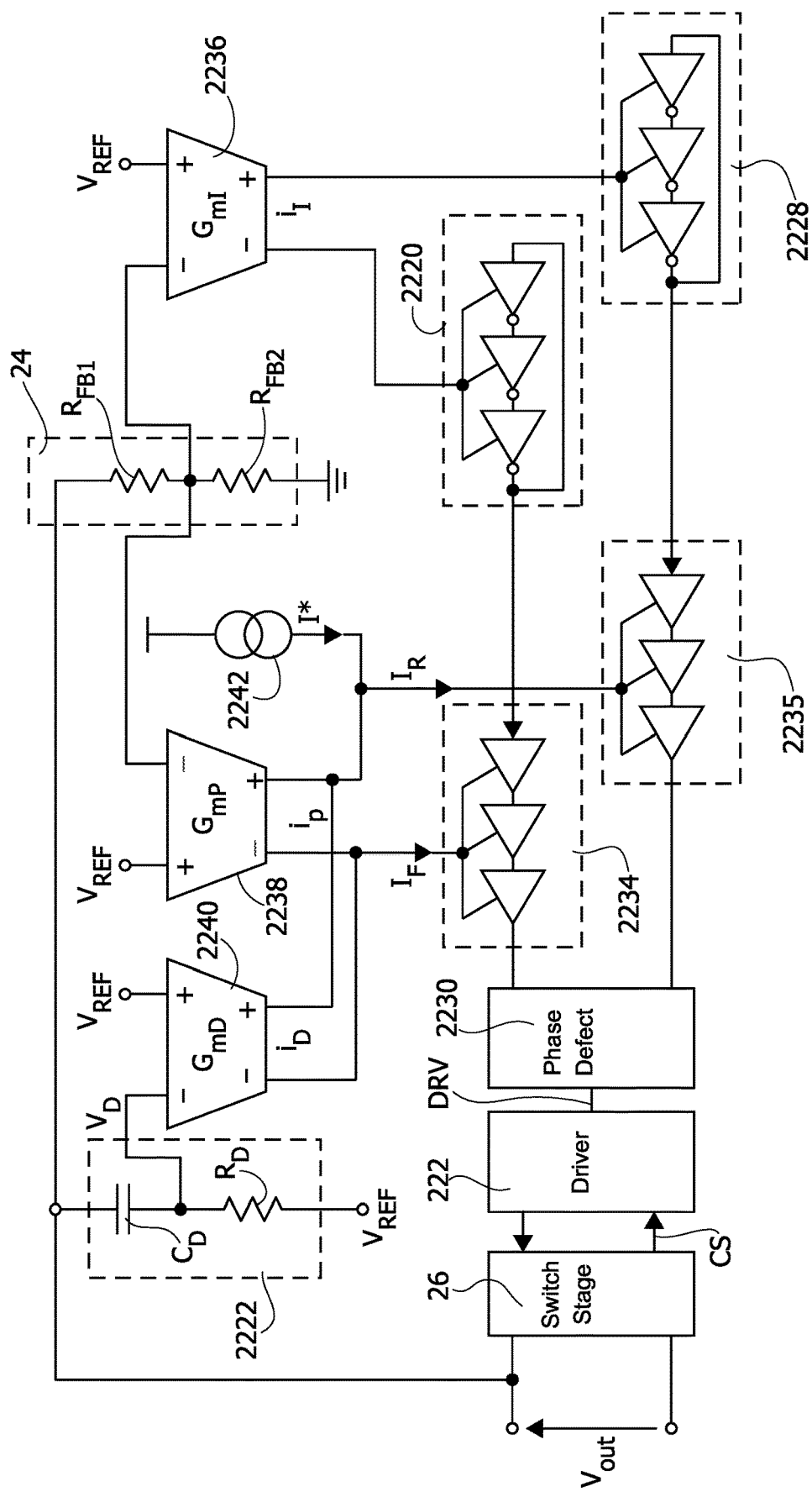
FIG. 13 shows a third embodiment of a control circuit for the electronic converter of FIG. 6.

For example, FIG. 13 shows an embodiment, wherein the PWM signal generator circuit 22a comprises a current source 2242 configured to provide a variable current I* (determined as a function of the feed-forward action) which is added to the current provided to the delay line 2235, i.e., $I_R = i_{P+} + i_{D+} + I^*$. However, as mentioned before the current I* could be provided with opposite sign to the delay line 2234, i.e., $I_F = i_{P-} + i_{D-} - I^*$, or a given contribution (with opposite signs) may be provided to both delay lines 2234 and 2235, e.g., $I_R = i_{P+} + i_{D+} + I^*/2$ and $I_F = i_{P-} + i_{D-} - I^*/2$.

The amount of current I* depends on different factors, starting from the gain K of the current controlled delay lines 2234 and/or 2235, the phenomena/event to compensate and the operation condition of the DC-DC converter.

For example, considering the example of a feed-forward action to compensate the CCM/DCM transition, the feed-forward current I* may be determined as described in the following. For example, assuming a boost converter as described with respect to FIG. 5, wherein the driver circuit 26 is configured to drive the electronic switches S1 and S2 to operate the converter either in CCM or DCM. For example, CCM may be used when the load 30 is high and DCM, when the load is reduced. On-the-fly transitions between such operating modes should be seamless on the output voltage.

For example, as mentioned before, the drive signal $DRV_1$ may correspond to the PWM signal DRV. Moreover, in CCM, the drive signal $DRV_2$ may correspond to the complementary version of the PWM signal DRV (possibly with additional dead times). Conversely, in DCM, the drive signal $DRV_2$ may be set to high when the PWM signal DRV goes to low (possibly with an additional dead time), and the drive signal $DRV_2$ may be set to low when the signal CS indicates that the current $I_L$ reaches zero/demagnetization of the inductance L.

For example, in order to determine whether to use CCM or DCM, the control circuit 20a may be configured to monitor the output current $i_{out}$ or the peak or average value of the current $I_L$, e.g., as a function of the signal CS. For example, assuming that the control circuit 20a is configured to use:
- CCM when the verification operation indicates that the output current $i_{out}$ is greater than a given threshold, e.g., 100 mA; and
- DCM when the verification operation indicates that the output current $i_{out}$ is smaller than the given threshold, e.g., 100 mA (possibly also using a hysteresis operation).

For example, based on the value of the input voltage $V_{in}$ and the output voltage $V_{out}$ and the characteristics of the converter, the PWM signal DRV may have a frequency of 1.5 MHz and:
- in CCM (at 100 mA) a switch-on duration $T_{ON}$ of 95 ns; and
- in DCM (at 100 mA) a switch-on duration $T_{ON}$ of 65 ns.

Accordingly, when switching from CCM to DCM, the switch-on duration $T_{ON}$ should be reduced by 30 ns, i.e., the current generator 2242 should provide a current I* which, e.g.:
- reduces the delay $t_{d1}$ by 30 ns, i.e., increases the current $I_F$;
- increases the delay $t_{d2}$ by 30 ns, i.e., decreases the current $I_R$; or
- in general, reduces the delay $t_{d1}$ by a time t1, and increases the delay $t_{d2}$ by a time t2, with t1+t2=30 ns.

For example, assuming current controlled delay lines 2234 and 2235 having a gain K=100 ns/μA and in steady-state are biased with a current $I_F = I_R = i_{D0} + i_{P0}$ of 4.5 μA, the current I* can be calculated as:

$$I^* = (-30 \text{ ns})/(100 \text{ ns/μA}) = -0.3 \text{ μA}$$

In general, the current may thus be applied with a given proportion k, with 0≤k≤1 (e.g., k=0.5) to the delay lines 2234 and 2235, i.e.:

$$I_R = i_{P+} + i_{D+} + k \cdot I^*.$$

$$I_F = i_{P-} + i_{D-} - (1-k) \cdot I^*.$$

Thus, due to the fact that I* is negative, the current $I_R$ will be reduced, thereby increasing the value $t_{d2}$, and/or the current $I_F$ will be increased, thereby decreasing the value $t_{d1}$. Generally, when switching from DCM to CCM, the current I* has again to be removed.

Figure 14:
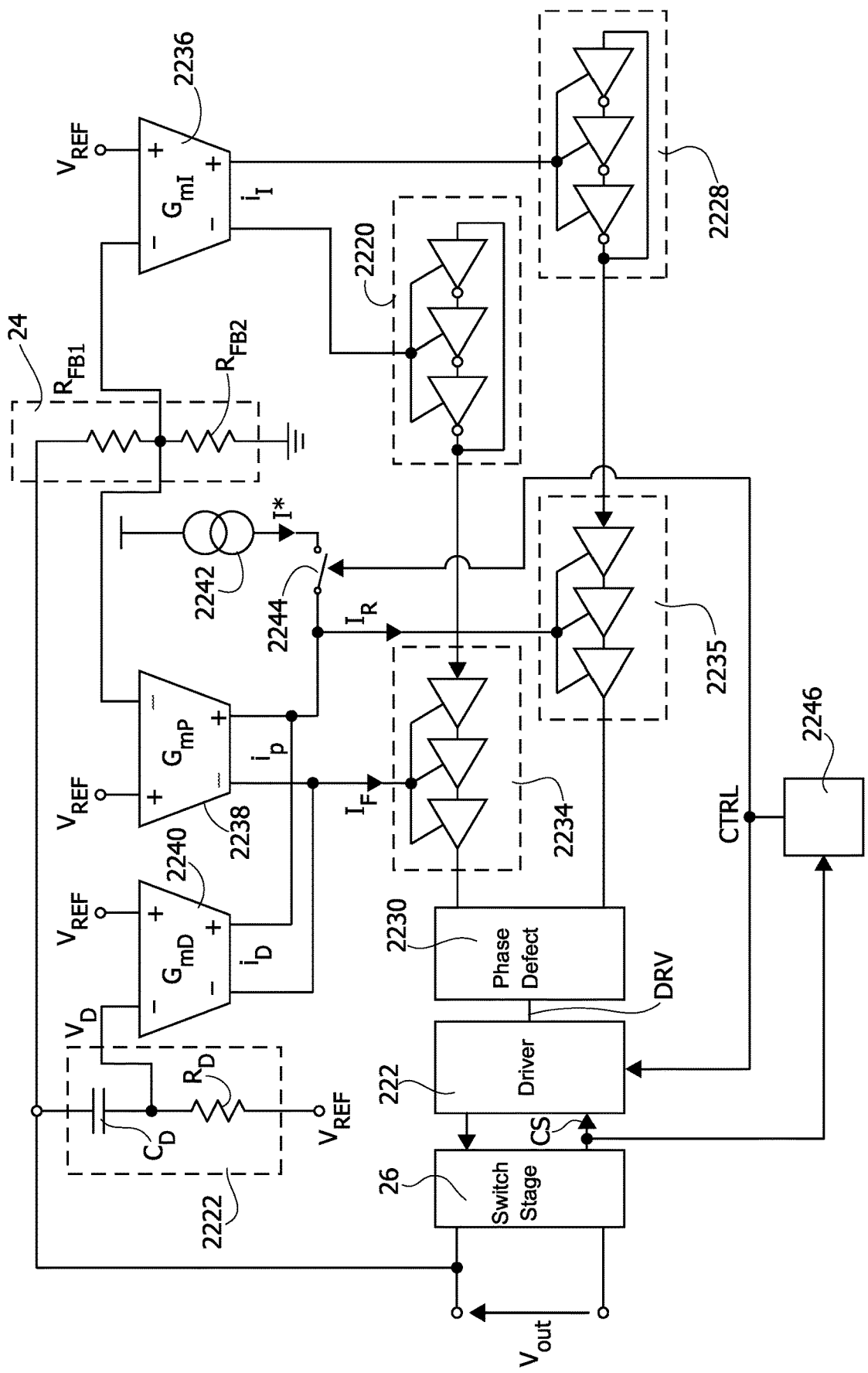
FIG. 14 shows a fourth embodiment of a control circuit for the electronic converter of FIG. 6.

Accordingly, as shown in FIG. 14, in various embodiments, the control circuit 20a may also comprise a (digital and/or analog) processing circuit 2246 configured to monitor one or more operating parameters of the switching stage 26 and decide whether to activate a given operating mode of the driver circuit 222, such as a DCM or CCM mode. For example, in FIG. 14, the processing circuit 2246 monitors the measurement signal CS. Next, the processing circuit 2246 generates one or more control signal CTRL for the driver circuit 222, e.g., in order to activate the DCM or the CCM mode. Similarly, the processing circuit 2246 provides one or more control signals CTRL (which may also correspond to the previously mentioned control signals for the driver circuit 222) in order to select a given compensation current I*. For example, when only supporting a DCM and a CCM mode, the control circuit 20a may be configured to provide the current I* in the DCM mode and not provide the current I* in the CCM mode, which is schematically shown via an electronic switch 2244 between the current generator 2242 and the delay line 2235, which is closed when the DCM mode is activated and opened when the CCM mode is activated.

The proposed solution permits thus a feed-forward control to overcome specific phenomena/events maintaining high performance. The proposed solution has a negligible impact on power consumption, since it simply involves the generation of a proper current sourced to (or sunk from) the input of the delay line 2234 and/or 2235.

In terms of system complexity and area consumption, there are negligible differences with respect to an implementation without the proposed feed-forward compensation and the advantages overcome such added minor complexity.

Eventually, it simply requires a minimal logic to trigger the feed-forward in response to the phenomena to compensate, and a current generator 2242, e.g., implemented with a current mirror, to create the proper feed-forward current I*.

In general, the proposed feed-forward implementation allows more than one feed-forward to work, regardless of the others (i.e., the presence of a specific feed-forward does not preclude/impair the action of another feed-forward), e.g., because a plurality of feed-forward currents I* may be summed.

As mentioned before, in various embodiments, the control circuit 20a may also be integrated in an integrated circuit. In this case, the integrated circuit may comprise:

- a terminal for connection to a feedback circuit 24, which may also be integrated in the same integrated circuit;
- a terminal for connection to an analog differentiator 2222, which may also be integrated in the same integrated circuit;
- one or more terminals for providing respective one or more drive signals to a switching stage 26 of an electronic converter, wherein also the one or more of the switches of the switching stage 26 may be integrated in the integrated circuit;
- a terminal for receiving at least one control signal CTRL from a control circuit 2246, which may also be integrated in the same integrated circuit;
- a driver circuit 222 configured to generate the one or more drive signals as a function of a PWM signal DRV, wherein the driver circuit 222 is configured to change mode of operation as a function of the control signal CTRL; and
- a PWM signal generator circuit 220a configured to generate the PWM signal DRV, wherein the PWM signal generator circuit 220a comprising at least one current-controlled delay line 2234 and/or 2235 (or similarly 2224 or 2226), wherein the respective control current ($I_F$ and/or $I_R$) is varied (substantially instantaneously) as a function of the control signal CTRL.

Of course, without prejudice to the principle of the invention, the details of construction and the embodiments may vary widely with respect to what has been described and illustrated herein purely by way of example, without thereby departing from the scope of the present invention, as defined by the ensuing claims.

For example, in various embodiments, the delay lines 2234 and 2235 may be implemented with current-controlled delay lines, while the oscillators 2220 and 2228 may be voltage-controlled oscillators as shown in FIG. 8 or current-controlled oscillators as shown in FIG. 11. In fact, in both cases at least the oscillator 2220 has a frequency determined as a function of the feedback signal FB. For example, the oscillator 2228 could also be supplied with the (constant) bias current $i_{I0}$ and only the oscillator 2220 could be supplied with the variable current $i_F$. Alternatively, the oscillator 2220 could also be supplied with the (constant) bias current $i_{I0}$ and only the oscillator 2228 could be supplied with the variable current $i_{I+}$.

Moreover, when using single ended transconductance amplifiers 2238 and 2240, the respective currents $i_P$, $i_D$ and the compensation current I* (each having a respective offset bias current) may be provided in any suitable combination to the delay lines 2234 and/or 2235, which may also be implemented with a series of separate delay lines driven by a respective current or combination of currents, e.g.:

- the current $i_P$, $i_D$ and I* may be provided to the delay line 2234, such as a first, second and third delay line receiving the currents $i_P$, $i_D$ and I*, respectively, and the delay line 2235 may be omitted;
- the current $i_P$, $i_D$ may be provided to the delay line 2234 and the compensation current I* may be provided to the delay line 2236.

Accordingly, in various embodiments, one or more first delay lines 2234 are connected between the oscillator 2220 and the phase detector 2230 and/or one or more second delay lines 2235 are connected between the oscillator 2228 and the phase detector 2230, wherein the one or more first delay lines 2234 and/or the one or more second delay lines 2235 are driven via the currents $i_P$, $i_D$ and I*.

The claims form an integral part of the technical teaching of the description provided herein.

The invention claimed is:

1. A control circuit for a switching stage of an electronic converter configured to provide an output voltage, the control circuit comprising:
   - a first terminal configured to provide a drive signal to an electronic switch of said switching stage;
   - a second terminal configured to receive a first feedback signal proportional to said output voltage;
   - a third terminal configured to receive a second feedback signal proportional to a derivative of said output voltage;
   - a phase detector circuit configured to generate said drive signal in response to a phase difference between a first clock signal and a second clock signal;
   - a first oscillator circuit configured to generate said first clock signal having a frequency that is determined as a function of said first feedback signal; and
   - a first controlled delay line connected between said first oscillator and a first input of said phase detector, said first controlled delay line configured to apply a delay to said first clock signal in response to a combination of said first feedback signal, said second feedback signal and a compensation signal indicative of a requested mode of operation for said electronic converter.

2. The control circuit according to claim 1, wherein said drive signal is pulse-width modulated (PWM).

3. The control circuit according to claim 1, further comprising a second oscillator circuit configured to generate said second clock signal having a frequency that is determined as a function of a reference voltage.

4. The control circuit according to claim 1, further comprising a second oscillator circuit configured to generate said second clock signal having a frequency that is determined as a function of said first feedback signal.

5. The control circuit according to claim 4, further comprising a differential amplifier circuit configured to generate a differential signal in response to a comparison of said first feedback signal to a reference voltage, and wherein a first current output and a second current output of said differential signal are applied to control the frequencies of the first and second oscillator circuits, respectively.

6. The control circuit according to claim 4, further comprising a second controlled delay line connected between said second oscillator and a second input of said phase detector, said second controlled delay line configured to apply a delay to said second clock signal in response to said combination of said first feedback signal, said second feedback signal and the compensation signal.

7. The control circuit according to claim 6, further comprising:
   - a first differential amplifier circuit configured to generate a first differential signal in response to a comparison of said first feedback signal to a reference voltage, and wherein a first output and a second output of said first differential signal are applied to control the delays of the first and second controlled delay lines, respectively.

8. The control circuit according to claim 7, further comprising:
a second differential amplifier circuit configured to generate a second differential signal in response to a comparison of said second feedback signal to a reference voltage, and wherein a first output and a second output of said second differential signal are applied to control the delays of the first and second controlled delay lines, respectively.

9. The control circuit according to claim 8, wherein said compensation signal comprises a differential compensation signal and wherein a first output and a second output of said differential compensation signal are applied to control the delays of the first and second controlled delay lines, respectively.

10. The control circuit according to claim 6, further comprising:
a second differential amplifier circuit configured to generate a second differential signal in response to a comparison of said second feedback signal to a reference voltage, and wherein a first output and a second output of said second differential signal are applied to control the delays of the first and second controlled delay lines, respectively.

11. The control circuit according to claim 10, wherein said compensation signal comprises a differential compensation signal and wherein a first output and a second output of said differential compensation signal are applied to control the delays of the first and second controlled delay lines, respectively.

12. The control circuit according to claim 1, wherein said driver circuit is configured to selectively operate said switching stage in Continuous-Conduction Mode (CCM) or Discontinuous-Conduction Mode (DCM) as a function of said requested mode of operation.

13. The control circuit according to claim 12, wherein said compensation signal has a first value when said requested mode of operation indicates DCM operation, and has a second value when said requested mode of operation indicates CCM operation, and wherein said second value is greater than said first value.

14. The control circuit according to claim 1, wherein said electronic converter is a buck or boost converter.

15. The control circuit according to claim 1, further comprising said one or more electronic switches of said switching stage.

16. The control circuit according to claim 1, further comprising a feedback circuit configured to generate said first feedback signal.

17. The control circuit according to claim 1, further comprising an analog differentiator configured to generate said second feedback signal from said first feedback signal.

18. An integrated circuit comprising a control circuit according to claim 1.

19. An electronic converter comprising:
a switching stage, and
a control circuit according to claim 1.

20. A control circuit for a switching stage of an electronic converter configured to provide an output voltage, the control circuit comprising:
one or more first terminals configured to provide one or more drive signals, respectively, to one or more electronic switches of said switching stage;
a second terminal configured to receive from a feedback circuit a first feedback signal proportional to said output voltage;
a third terminal configured to receive from an analog differentiator a second feedback signal proportional to a derivative of said output voltage;
a fourth terminal configured to receive a control signal indicative of a requested mode of operation from a processing circuit;
a driver circuit configured to generate said one or more drive signals as a function of a Pulse-Width Modulation (PWM) signal, wherein said driver circuit is configured to change mode of operation as a function of said control signal; and
a PWM signal generator circuit configured to generate said PWM signal as a function of said first feedback signal, said second feedback signal and a reference voltage, wherein said PWM signal generator circuit comprises:
a first oscillator configured to generate a first clock signal;
a second oscillator configured to generate a second clock signal;
wherein a frequency of at least one of the first and second clock signals is determined as a function of said first feedback signal;
a first operational transconductance amplifier configured to generate a first current indicative of a difference between said reference voltage and said first feedback signal;
a second operational transconductance amplifier configured to generate a second current indicative of a difference between said reference voltage and said second feedback signal;
a current generator configured to generate a compensation current as a function of said control signal;
a phase detector providing said PWM signal at an output;
one or more first current-controlled delay lines connected between said first oscillator and a first input of said phase detector; and
one or more second current-controlled delay lines connected between said second oscillator and a second input of said phase detector;
wherein a delay of the first clock signal provided by said one or more first current-controlled delay lines and a delay of the second clock signal provided by said one or more second current-controlled delay lines is controlled by said first current, said second current and said compensation current; and
wherein said phase detector generates said PWM signal as a function of a phase difference between the delayed first and second clock signals.

21. The control circuit according to claim 20, wherein said first oscillator is a voltage controlled oscillator configured to generate said first clock signal with a frequency determined as a function of said first feedback signal, and wherein said second oscillator is configured to generate said second clock signal with a frequency determined as a function of a reference voltage.

22. The control circuit according to claim 20, wherein said first oscillator is a current controlled oscillator configured to generate said first clock signal with a frequency determined as a function of a third current, and wherein said second oscillator is a current controlled oscillator configured to generate said second clock signal with a frequency determined as a function of a fourth current, and wherein the control circuit comprises:
a third operational transconductance amplifier configured to provide said third current and said fourth current, wherein a difference between said third and fourth currents is proportional to a difference between a reference voltage and said first feedback signal.

23. The control circuit according to claim 20, wherein:
said one or more first current-controlled delay lines comprise a first current-controlled delay line having a delay determined as a function of a fifth current; and
said one or more second current-controlled delay lines comprise a second current-controlled delay line having a delay determined as a function of a sixth current.

24. The control circuit according to claim 23,
wherein said first operational transconductance amplifier is a differential operational transconductance amplifier configured to provide a seventh current and an eighth current, wherein a difference between said seventh and eighth currents is proportional to a difference between a reference voltage and said first feedback signal;
wherein said second operational transconductance amplifier is a differential operational transconductance amplifier configured to provide a ninth current and a tenth current, wherein a difference between said ninth and tenth currents is proportional to a difference between said reference voltage and said second feedback signal; and
wherein said control circuit further comprises:
a first summation node providing said fifth current by adding said seventh current to said ninth current; and
a second summation node providing said sixth current by adding said eighth current to said tenth current.

25. The control circuit according to claim 24, wherein said compensation current is subtracted from said first summation node.

26. The control circuit according to claim 24, wherein said compensation current is added to said second summation node.

27. The control circuit according to claim 24, wherein a portion of said compensation current is subtracted from said first summation node, and a portion of said compensation current is added to said second summation node.

28. The control circuit according to claim 20, wherein said driver circuit is configured to selectively operate said switching stage in Continuous-Conduction Mode (CCM) or Discontinuous-Conduction Mode (DCM) as a function of said control signal.

29. The control circuit according to claim 28, wherein said compensation current has a first value when said control signal indicates DCM operation, and has a second value when said control signal indicates CCM operation, and wherein said second value is greater than said first value.

30. The control circuit according to claim 20, wherein said electronic converter is a buck or boost converter.

31. The control circuit according to claim 20, further comprising said one or more electronic switches of said switching stage.

32. The control circuit according to claim 20, further comprising said feedback circuit.

33. The control circuit according to claim 20, further comprising said analog differentiator.

34. The control circuit according to claim 20, further comprising said processing circuit.

35. An integrated circuit comprising a control circuit according to claim 20.

36. An electronic converter comprising:
a switching stage, and
a control circuit according to claim 20.

* * * * *